United States Patent
Childs

[19]

[11] Patent Number: 5,907,168
[45] Date of Patent: May 25, 1999

[54] LOW NOISE GE-JFETS

[75] Inventor: Timothy T. Childs, Minnetonka, Minn.

[73] Assignee: TLC Precision Wafer Technology, Inc., Minneapolis, Minn.

[21] Appl. No.: 09/012,477

[22] Filed: Jan. 23, 1998

[51] Int. Cl.$^6$ .......................... H01L 29/267; H01L 29/12
[52] U.S. Cl. .......................... 257/256; 257/272; 257/285; 257/616
[58] Field of Search .................................. 257/616, 348, 257/410, 192, 194, 279, 256, 272, 285

[56] References Cited

U.S. PATENT DOCUMENTS

| | | | |
|---|---|---|---|
| 2,900,531 | 8/1959 | Wallmark ................................. | 257/616 |
| 2,978,367 | 4/1961 | Kestenbaum et al. ................... | 257/616 |
| 4,322,738 | 3/1982 | Bell et al. ............................... | 257/273 |
| 4,325,180 | 4/1982 | Curran .................................... | 257/262 |
| 4,373,253 | 2/1983 | Khadder et al. ......................... | 438/17 |
| 4,496,963 | 1/1985 | Dunkley et al. ......................... | 257/272 |
| 4,596,068 | 6/1986 | Peters, Jr. ................................ | 438/194 |
| 4,668,971 | 5/1987 | Hynecek ................................. | 257/239 |
| 4,796,073 | 1/1989 | Bledsoe .................................. | 257/590 |
| 4,983,536 | 1/1991 | Bulat et al. ............................. | 438/192 |
| 5,126,805 | 6/1992 | Bulat et al. ............................. | 257/136 |
| 5,406,098 | 4/1995 | Hyuga et al. ........................... | 257/192 |
| 5,780,922 | 7/1998 | Mishra et al. .......................... | 257/347 |

*Primary Examiner*—Donald L. Monin, Jr.
*Attorney, Agent, or Firm*—Roger W. Jensen

[57] ABSTRACT

A Germanium junction field effect transistor (Ge-JFET) is fabricated in a manner to produce low noise and which is particularly suitable for a cryogenic detector. The Ge-JFET in accordance with the present invention comprises a germanium base material on which a phosphorous implanted channel region is implanted thereon. A boron cap layer overlies the channel region. On the cap layer are separately spaced drain and source ohmic contact regions, and a gate ohmic contact region therebetween. The drain and source ohmic contact regions are separately spaced arsenic implant regions and a phosphorous implant region. The gate ohmic contact region is a $BF_2$ implanted region.

15 Claims, 1 Drawing Sheet

LOW NOISE GE-JFETS

FIELD OF THE INVENTION

The present invention relates generally to junction field effect transistors (JFETS) more particularly to low noise germanium—JFETS, particularly applicable to cryogenic applications.

BACKGROUND OF THE INVENTION

JFETS fabricated on silicon substrates which employ boron and/or phosphorous in the constituent layers or regions are quite well known. For example, U.S. Pat. No. 4,322,738, issued to Bell, et al., describes a buried n-channel JFETS said to have very low gate leakage current and excellent noise and matching characteristics. According to Bell, et al., a p-type monocrystalline silicon substrate, or "slice," has a spin-on arsenic source applied to it, the slice is high temperature annealed to diffuse the arsenic into the substrate, and then an arsenic doped epitaxial layer is grown on the slice. As recited in the patent, "The slice is then subjected to a boron "deposition" step where the boron is "deposited" in surface areas of the epitaxial layer 12. After the boron glass is removed, the slice is placed in a high temperature furnace tube to diffuse the "deposited" boron through the epitaxial layer 12 until it reaches the silicon substrate 10." Subsequently, several boron layers are deposited sequentially on the epitaxial layer and phosphorous is later diffused into the slice.

U.S. Pat. No. 4,325,180, issued to Curran, relates to a P-JFET based on a monocrystalline p-type silicon substrate with a silicon oxide layer formed thereon. Boron ions are implanted and phosphorous is subsequently applied. After implantation of P-JFET channels, the entire slice receives a boron implant.

U.S. Pat. No. 4,373,253, issued to Khadder, et al., describes a JFET device fabricated into a conventional CMOS monolithic IC to provide linear circuit operation said to have low noise characteristics. The starting substrate is a silicon wafer with a surface oxide. First and second layers of fast diffusing boron implants are added, and a JFET channel is created. Arsenic ions are implanted through a hole in the oxide layer. Channel stops, p-channel source/drain electrodes and JFET gate contacts are created. Phosphorous can be implanted to create an N-type top cap. The noise normally associated with field effect devices is said to be greatly reduced, because all of the JFET active region, the channel, is subsurface.

U.S. Pat. No. 4,496,963, issued to Dunkley, et al., relates to a JFET with a gate region, source/drain regions, and a channel region extending through the gate region between the source and drain regions. For surface stabilization, the channel region has a shallow ion implanted layer of doping material. The substrate is silicon with an oxide layer onto which boron is implanted. Phosphorous is implanted using a very shallow N-type ion implant. In accordance with the disclosure, an N-type ion implant, such as a phosphorous ion implant, is said to stabilize the surface region and eliminate the noise typically generated in JFETS.

U.S. Pat. No. 4,596,068, issued to Peters, describes JFETS in which the surface of the channel and top gates are compensated after a high temperature processing by ion implanting boron onto a silicon substrate through a protective layer. The surface is covered with a thick field oxide. An N-JFET protective layer is grown over the silicon surface. An N-type dopant, such as phosphorous, is then implanted to complete the N-channel of the N-JFET by forming a thin N-channel region displaced below the wafer surface.

U.S. Pat. No. 4,668,971, issued to Hynecek, concerns low noise amplifiers integrated with a CCD array. The gate of the JFET can be formed with the same implant which forms the virtual phase electrode in an array of virtual phase CCD cells. A p-type substrate has an oxide grown on it. A channel stop implant mask is used to expose channel stop regions to a p-type boron implant. A virtual well implant and a blanket virtual barrier implant, both of phosphorous, are then applied. A deep p-type implant of boron is added. To create the buried channel MOSFETs, the moat region in the periphery is exposed to the buried channel implant and a light dose phosphorous implant, which is performed before the poly gate level is patterned. The JFETS of Hynecek are long high-pinchoff devices said to be useful for loads where special low noise performance is required. The JFETS may be used as loads in source-follower stages U.S. Pat. No. 4,796,073, issued to Bledsoe, relates to improving noise considerations in P channel JFETS. A gettering region is formed in the top surface by producing high concentration surface damage in the semiconductor crystal lattice in the top surfaces. A large inactive N+ region is provided in the P channel JFET to getter impurities away from active areas. The ratio of inactive N+ area to the total area of the transistor is said to be selected to provide suitably low noise measurements at low frequencies.

U.S. Pat. Nos. 4,983,536 and 5,126,805, issued to Bulat, et al., relate to static induction transistor JFETS. Prior to metallization, a thin layer of germanium is intermixed with the underlying silicon and recrystallized to form a germanium-silicon composite. The composite overlies the exposed silicon of the source and gate regions. Alternatively, a single crystal epitaxial layer may be deposited on the silicon. Ohmic source and gate contact members are then produced by conventional metallization procedures. The contact resistance of the device is said to be reduced by virtue of the reduced bandgap provided by the presence of the germanium.

JFET technology is presently preferred for cryogenic detectors. The limits of other transistor technologies, including bipolar, silicon-metal oxide semiconductor field effect transistor (Si-MOSFET) and germanium arsenide-metal gate Schottky field effect transistor (GaAs-MESFET) technology, makes them much less compatible for cryogenic applications. For example, the base current of bipolar transistors adds parallel noise to the system degrading its resolution. Si-MOSFETS suffer from radiation damage. Furthermore, Si-MOSFETS are susceptible to generation and recombination effects due to the $Si/SiO_2$ interface. Typical MESFETS, including GaAs-MESFETS, suffer from excessive power dissipation and are susceptible to interface effects due to the Schottky barrier and the passivation layer interface.

JFETS similar to types described and known in the prior art remain noisy particularly for cryogenic applications. Thus there exists a need for a JFET structure which exhibits low noise characteristic and is simple to manufacture.

SUMMARY OF THE INVENTION

It is an object of the present invention to a provide a Germanium junction field effect transistor (Ge-JFET) which exhibits superior Germanium low temperature carrier mobilities so as to enhance low noise characteristics.

An object of the present invention is a provide a Germanium junction field effect transistor (Ge-JFET) suitable for use in low noise cryogenically cooled detectors operating at temperatures of in the range of 2° to 4° Kelvin for low audio frequencies in the range of 10 to 100 Hz.

Another object of the present invention is to provide a method of fabricating a Germanium junction field effect transistor (Ge-JFET) suitable for use in low noise cryogenically cooled detectors operating at temperatures of about 4° Kelvin.

In accordance with the present invention, A Ge-JFET is fabricated on a p-type germanium substrate for the base material. A phosphorous implanted n-type channel region is first implanted on the substrate. A boron implanted p-type cap layer overlies the phosphorous implanted n-type channel region. Fabricated on the p-type cap layer are separately spaced drain and source ohmic contact regions. A gate ohmic contact region is fabricated between the drain and source ohmic contact regions. The drain and source ohmic contact regions are comprised of separately spaced $n^+$ arsenic implant regions and a phosphorous implant region. The gate ohmic contact region is comprised of a $p^+$ $BF_2$ implanted region.

DETAILED DESCRIPTION OF THE INVENTION

Figure 1:
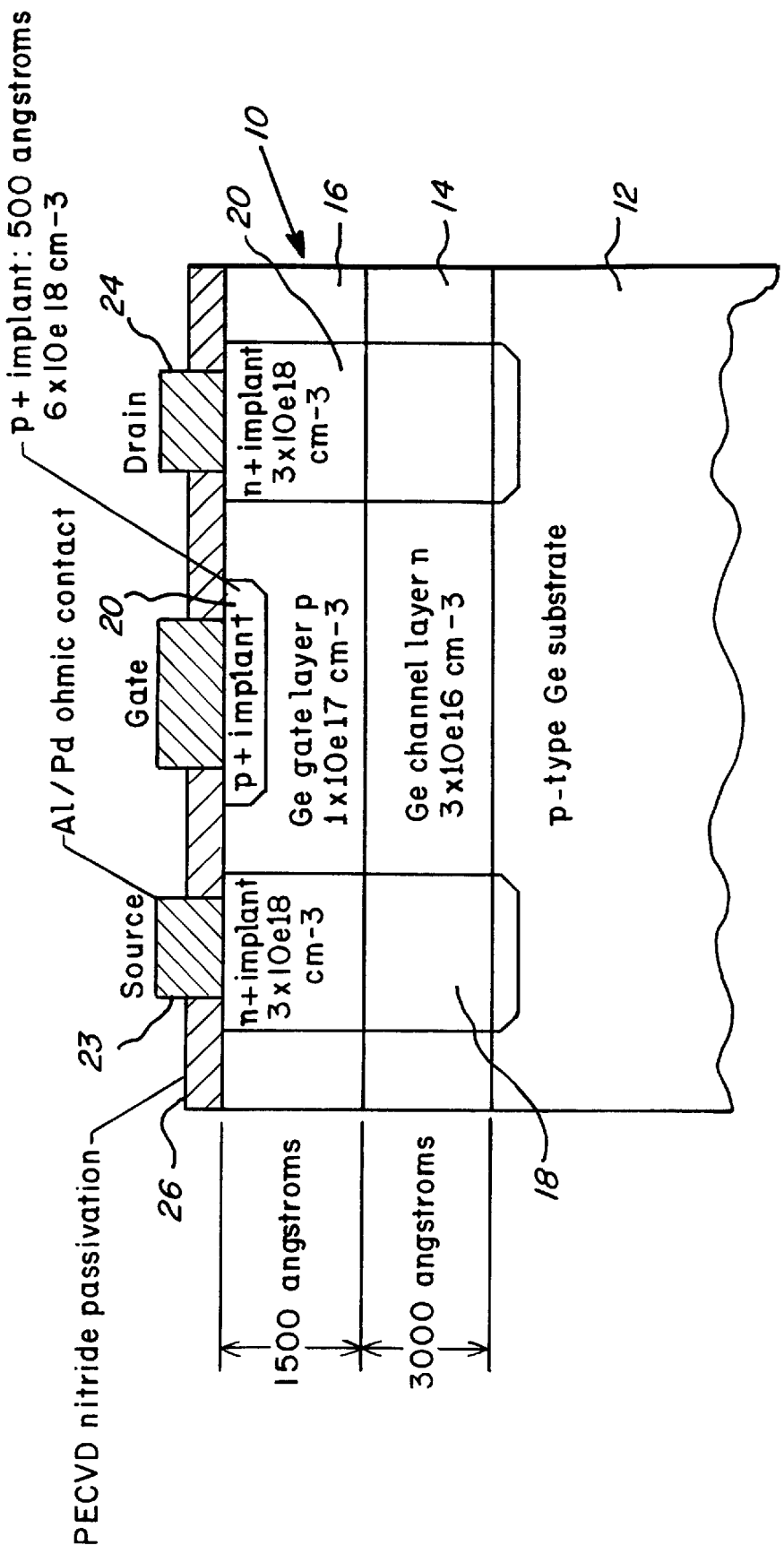
FIG. 1 is a cross-sectional profile of a Ge-JFET according to the present invention.

FIG. 1 is a cross-sectional profile of a Ge-JFET, fabricated in accordance with the present invention, and which illustrates a sequence of layers for a Ge-JFET 10. Ge-JFET 10 includes a p-type germanium substrate base material or wafer 12. As is well understood to those skilled in the art, only one Ge-JFET 10 is illustrated in FIG. 1, however many more may be simultaneously fabricated on a wafer or slice generally indicated by numeral 12. Alternatively, substrate 12 may be germanium implanted silicon, such as used in the JFETS described in Bulat, et al., U.S. Pat. Nos. 4,983,536 and 5,126,805.

Phosphorous impurities are implanted on substrate 12 to form an n-type channel layer or region 14 of a selected thickness. In turn, boron impurities are implanted on layer 14 to form a p-type cap layer or region 16 of a selected thickness. Implanted on cap layer 16 are $n^+$ implants for the drain and source ohmic contact regions 18 and 20 extending through p-type cap layer 16 and at least a large portion of n-type channel region 14, and may also extend beyond the thickness of the n-type channel region 14 through to the base substrate 12.

Drain and source ohmic contact regions 18 and 20 in the preferred embodiment of the present invention are each fabricated by two shallow arsenic implants and a deep phosphorous implant. A gate ohmic contact region or layer 22 is fabricated on p-type cap layer 16 by way of a $BF_2$ implanted thereon.

Conventional metallization procedures are employed to produce ohmic drain-source contact regions on cap layer 16. Low resistance ohmic contacts 23 and 24, for the source and drain contact regions respectively, are provided by Al/Pd implants on each of the drain/source contact regions 18 and 20. Finally, a top surface of the device is provided with a nitride passivation layer 26 which may be a plasma enhanced chemical vapor deposition (PECVD) nitride passivation layer.

In an exemplary device, n-type channel layer 14 is in the order of 3000 angstroms thick with a carrier concentration in the order of $3\times10^{16}$ $cm^{-3}$, p-type cap layer 16 is in the order of 1500 angstroms thick with a carrier concentration in the order of $1\times10^{17}$ $cm^{-3}$. Drain and source regions 18 and 20 are fabricated to each have a $n^+$ carrier concentration of $3\times10^{18}$ $cm^{-3}$ layer having thickness extending into the substrate 12 through layers 14 and 16—in excess of 4500 angstroms. Gate region 22 is fabricated to have a $p^+$ carrier concentration of $6\times10^{18}$ $cm^{-3}$. However, layer 14 could vary between 100 Å and 5000 Å and the associated carrier concentration could vary between $1\times10^{16}$ to about $1\times10^{17}$ $cm^{-3}$. Further, the layer 16 could vary between 100 Å and 5000 Å and the associated carrier concentration could vary between $1\times10^{16}$ to about $1\times10^{18}$ $cm^{-3}$.

Although typical layer or region thickness and carrier concentration have been indicated for the Ge-JFETS of the present invention, it will be recognized by those of skill in this art that all of these may be adjusted for optimization of device 10. In addition, it will be well understood by those of skill in this art, that other elements may be substituted for the specific elements identified above for the layers or regions of these Ge-JFETS.

In conventionally available JFETS, parasitic contact resistance contributes to the noise level. The Ge-JFETS 10 in accordance with the present invention utilize low resistance ohmic contacts 23 and 24 formed with Al/Pd to lessen the effects of parasitic resistance. In addition, the Ge-JFETS 10 according to the present invention are provided with a surface passivation layer 26 as aforesaid. In a typical device 10, passivation layer 26 may be a plasma enhanced chemical vapor deposition (PECVD) nitride passivation layer.

Two representative Ge-JFET devices fabricated in accordance with the present invention were tested by Dr. Murzy Jhabvala of NASA Goddard Space Center. At 4° Kelvin, the two Ge-JFET devices exhibited noise measurements of 558.5 nV/sqrt (Hz) and 146.3 nV/sqrt (Hz), respectively, at 30 Hz.

The Ge-JFETS 10 according to the present invention find use in cost-effective monolithic fiber-optic receivers, in low temperature/cryogenic detectors, and in high-speed low temperature read-out electronics.

While the present invention has been described with reference to the illustrative embodiment, it is not intended that this description be construed in a limiting sense. Various modifications of the illustrated embodiment, as well as other embodiments of the present invention, will be apparent to persons skilled in the art upon reference to this description. It is therefore contemplated that the appended claims will cover any such modifications any such embodiments as fall within the true spirit and scope of the present invention.

More specifically, the carrier concentrations and thickness' of the various regions and channels are only exemplary. Other dopant materials and/or metals or semiconductor materials may be altered from that described herein in order to obtain the indicated conductivity type and/or carrier concentrations.

The embodiments of an invention in which an exclusive property or right is claimed are defined as follows:

1. A germanium-junction field effect transistor (Ge-JFET) comprising:
   a germanium substrate;
   a phosphorous implanted channel region on the substrate;
   a boron implanted cap layer on the channel region;
   spaced apart drain and a source ohmic contact region fabricated on the cap layer; and
   a gate ohmic contact region fabricated on the cap layer between the drain and source contact regions.

2. The Ge-JFET according to claim 1, wherein the substrate, the cap layer, and the gate ohmic contact regions are each of a first conductivity type, and the channel region and the drain/source ohmic contact regions are each of an opposite conductivity type.

3. The Ge-JFET according to claim 2, wherein the first conductivity type is p-type; and the second conductivity type is n-type.

4. The Ge-JFET according to claim 1, wherein the phosphorous implanted channel region is between about 100 Å and 5000 Å with a carrier concentration of between about $1\times10^{16}$ to about $1\times10^{17}$ cm$^{-3}$.

5. The Ge-JFET according to claim 4, wherein the phosphorous implanted channel region is approximately 3000 angstroms thick with a carrier concentration in the order of $3\times10^{16}$ cm$^{-3}$.

6. The Ge-JFET according to claim 1, wherein the boron implanted cap layer is between about 100 Å and 5000 Å with a carrier concentration of between about $1\times10^{16}$ to about $1\times10^{18}$ cm$^{-3}$.

7. The Ge-JFET according to claim 5, wherein the boron implanted cap layer is approximately 1500 angstroms thick with the carrier concentration in the order of $3\times10^{16}$ cm$^{-3}$.

8. The Ge-JFET according to claim 1, wherein each of said drain and source ohmic contact regions are spaced apart arsenic implant region, and a phosphorous implant region, and where the thickness of each of said drain and source contact regions sufficient to extend at least substantially into said channel region.

9. The Ge-JFET according to claim 8, wherein each of said arsenic drain and source ohmic contact regions is approximately 3000 angstroms thick with carrier in the order of $3\times10^{16}$ cm$^{-3}$.

10. The Ge-JFET according to claim 1, wherein the said gate ohmic contact region is $BF_2$ implanted on said p-type cap layer between 100 Å and 1000 Å with a carrier concentration of between about $1\times10^{17}$ to about $1\times10^{19}$ $BF_2$.

11. The Ge-JFET according to claim 1, wherein said gate ohmic contact region is $BF_2$ implanted on said p-type cap layer to approximately 500 angstroms thick with a carrier concentration in the order of $3\times10^{16}$ cm$^{-3}$.

12. A method of making a low noise germanium-junction field effect transistor (Ge-JFET) comprising the steps of:

implanting a phosphorous channel region on a germanium substrate;

implanting a boron cap layer on the phosphorous channel region;

fabricating drain and source ohmic contact region on the cap; and fabricating a gate ohmic contact region on the cap.

13. The method of claim 12, wherein the substrate, the cap layer, and the gate ohmic contact regions are each of a first conductivity type, and the channel region and the drain/source ohmic contact regions are each of an opposite conductivity type.

14. The method of claim 12 wherein the first conductivity type is p-type; and the second conductivity type is n-type.

15. The method of claim 14 wherein said drain and source ohmic contact regions include both arsenic and phosphorous implants, and said ohmic contact gate regions include a shallow implant of $BF_2$.

* * * * *